United States Patent
Wheeler

(10) Patent No.: US 6,170,071 B1
(45) Date of Patent: Jan. 2, 2001

(54) METHOD FOR OPTIMIZING TEST FIXTURES TO MINIMIZE VECTOR LOAD TIME FOR AUTOMATED TEST EQUIPMENT

(75) Inventor: Paul K. Wheeler, Allentown, PA (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/123,380

(22) Filed: Jul. 27, 1998

(51) Int. Cl.[7] ............................ G01R 31/28; G01R 31/02
(52) U.S. Cl. ..................... 714/724; 714/736; 714/738; 324/73.1; 324/537; 324/763
(58) Field of Search .................... 714/724, 718, 714/738, 736; 324/73.1, 158.1, 537, 763

(56) References Cited

U.S. PATENT DOCUMENTS

| | | | |
|---|---|---|---|
| 4,348,759 | * 9/1982 | Schnurmann | 714/718 |
| 4,724,379 | * 2/1988 | Hoffman | 324/73.1 |
| 5,014,002 | 5/1991 | Wiscombe et al. | 324/537 |
| 5,432,797 | * 7/1995 | Takano | 714/738 |
| 5,537,052 | 7/1996 | Wilson et al. | 324/763 |
| 5,673,272 | * 9/1997 | Proskauer et al. | 714/724 |
| 5,701,309 | 12/1997 | Gearhardt et al. | 714/736 |

* cited by examiner

Primary Examiner—Emmanuel L. Moise
(74) Attorney, Agent, or Firm—Synnestvedt & Lechner LLP

(57) ABSTRACT

A systematic method for assigning tester channels on an Automated Test Equipment (ATE) to various signal pins on Device Under Test (DUT). The method involves creating a test fixture or a load board for a digital Integrated Circuit (IC) by wiring the DUT pins to as few channel groups as possible. The number of channel groups required for each vector set load are calculated before the signal pins are assigned. Then, the signal pins are assigned in a systematic manner to the fewest number of channel groups. As the number of test channel groups is reduced, the amount of vector data loaded into the tester's vector memory before each test vector is executed also is reduced, therefore reducing the time and cost required to test the signal pins on the DUT.

25 Claims, 3 Drawing Sheets

METHOD FOR OPTIMIZING TEST FIXTURES TO MINIMIZE VECTOR LOAD TIME FOR AUTOMATED TEST EQUIPMENT

FIELD OF THE INVENTION

This invention generally relates to the testing of digital integrated circuits by Automated Test Equipment (ATE). Specifically, the invention relates to assignments from tester channels on ATEs to signal pins on device under test.

BACKGROUND OF THE INVENTION

The use of ATEs for digital Integrated Circuit (IC) testing is widely known in the art. A typical ATE has many tester channels or resources which are connected to signal pins on the device under test (DUT).

Prior art design of ATE designs have arbitrary assignment of the signal pins on the DUT to the tester channels on ATEs. That is, irrespective of the layout of the pins on the DUT, the prior art design utilizes a standard and random assignment scheme for assigning tester channels on the ATE to the signal pins on the DUT.

Such a channel assignment scheme slows the performance of the ATEs as it creates unnecessary overhead requirements on the execution time of the ATEs. The execution time of any ATE test machine comprises overhead time plus actual test time for testing the DUT. The overhead time is the time spent performing some function other than actual testing of the DUT, and includes for example, the loading of test vector sets into vector memory before the actual testing can take place.

In prior art ATEs, especially in ATEs with bus architectures, the overhead time for loading test vector sets into the vector memory is usually many times longer than the actual test time.

For example, in a typical ATE, the channels are arranged in channel groups wherein each single group is made of eight channels. In these particular ATEs, the test vectors are loaded into memory by sequential loading of channel groups. ATEs load one group at a time, i.e., eight bits per clock cycle, wherein each group is made of eight channels. Thus, ideally, if 128 signal pins need to be tested, correspondingly, 128 channels need to be loaded. As channels are loaded in channel groups of eight, only 16 vector set loads will be required.

However, in the prior art design, this is not the case as signal pins have been randomly assigned to various channel groups. For example, signal pin number 1 may have been assigned to channel group number 3; signal pin number 2 may have been assigned to channel group number 4; signal pin number 3 may have been assigned to channel group number 1. ATEs load vector data by loading the channel groups by the order of channel group numbers. The whole group is loaded at once regardless of how many channels in that group are actually loaded. For instance, ATE would first load channel group number 1, therefore, data for signal pin number 3 will be loaded. Then data for channel group number 3 will be loaded, therefore data for signal pin number 1 will be loaded. And then channel group number 4 is to be loaded, therefore data for signal pin number 2 will be loaded.

This shows the inefficiency in prior art design. To test three signal pins, three different channel groups were loaded. Had signal pins been assigned in a systematic manner by first completing assignments to the first channel group, only one data load (channel group number 1) would have been required.

Thus, there exists a need for an improved method for tester channel assignment which reduces overhead time of ATEs thereby causing a significant cost savings.

SUMMARY OF THE INVENTION

The present invention offers a systematic method for assigning tester channels on ATEs to various signal pins on DUTs. The method involves creating a test fixture or a load board for a digital IC by wiring the DUT pins to as few channel groups as possible.

The inventive method calculates the number of channel groups required for each vector set load before the signal pins are assigned. Then, the signal pins are assigned in a systematic manner to the fewest number of channel groups.

As the number of test channel groups is reduced, the amount of vector data loaded into the tester's vector memory before each test vector is executed also is reduced, therefore reducing the time and cost required to test the signal pins on the DUT.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF A PREFERRED EMBODIMENT

Reference will now be made in detail to the preferred embodiments of the invention, examples of which are illustrated in the accompanying drawings. While the invention will be described in conjunction with the preferred embodiments, it will be understood that it is not intended to limit the invention to embodiments on modifications and equivalents, which may be included within the spirit and scope of the invention as defined by the appended claims.

Figure 1:
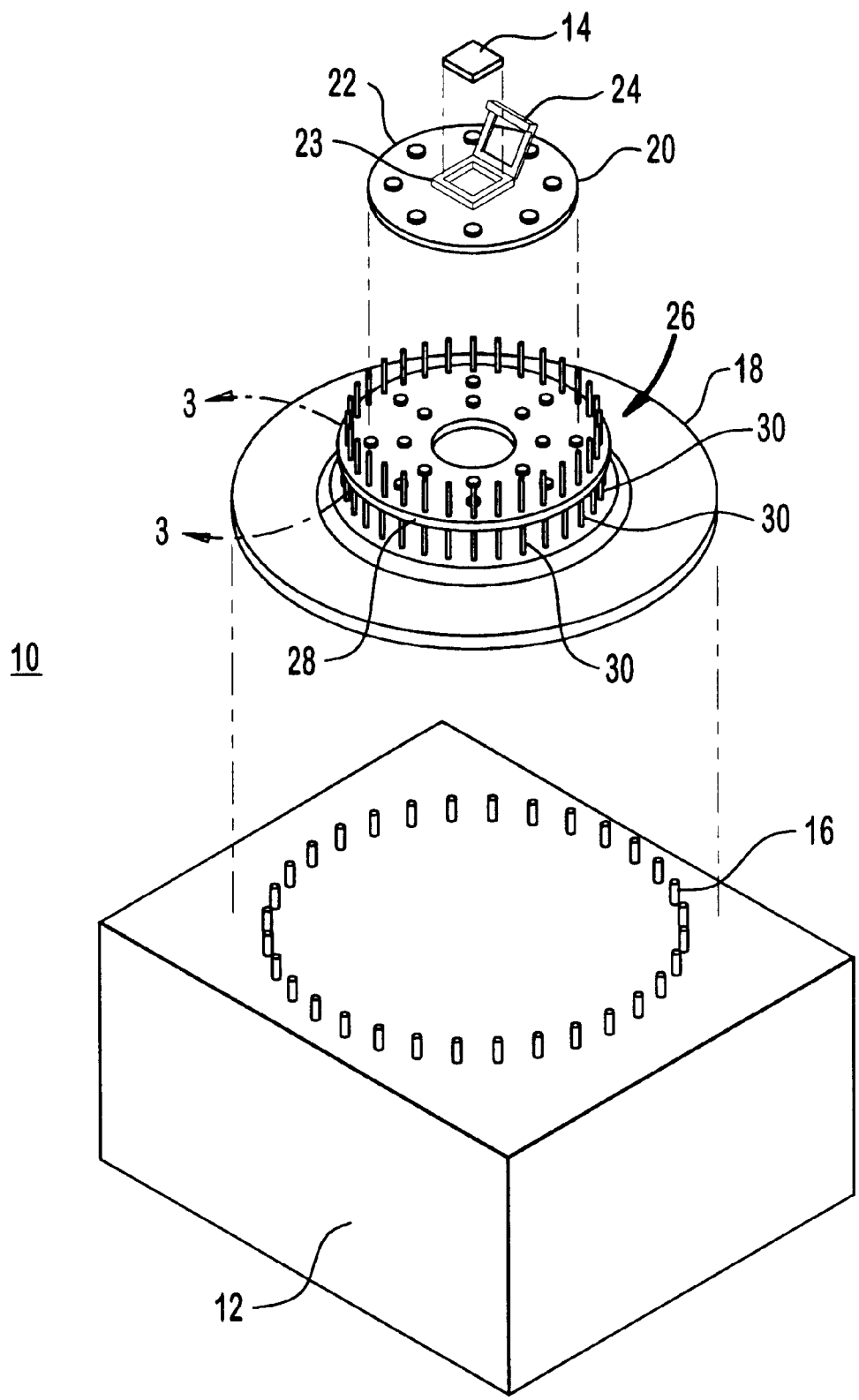
FIG. 1 is an exploded, perspective view of an interface board of a prior art ATE, and a device under test board showing their relationship.

FIG. 1 shows an overview of an ATE system 10 of the prior art such as manufactured by a number of vendors. Such an ATE system 10 includes a test head system 12, which includes electronic circuits (not shown) which are controlled by the software of a host control computer. These electronic circuits, called tester channels, generate the necessary test signals and control signals for each particular type of integrated circuit DUT 14. To test the performance of a particular DUT 14, various test signals as well as power supply voltages and ground potentials are made available on a number of tester channels 16, which are located on the top surface of the test head 12 and arranged in a circular pattern as indicated in the drawing. To test a DUT 14, which has, for example, 256 or more signal pins, 256 or more tester channels 16 are provided on the test head 12.

To provide for connections between the DUT 14 and the various tester channels 16, an interface board 18 typically is provided between the tester channels 16 and the DUT 14. The tester channels engage with corresponding sockets on the interface board 18. Note that the interface board must provide, for example, signal lines, or traces for all signal pins or power connections. To facilitate uniform testing of a large number of DUT pins, interface boards 18 are often circular, multi-layer, printed circuit boards with several power and ground planes. Signal traces start at the periphery of the circular interface board 18 and converge toward the center of the interface circuit board 18, upon which the DUT 14 is mounted.

Figure 2:
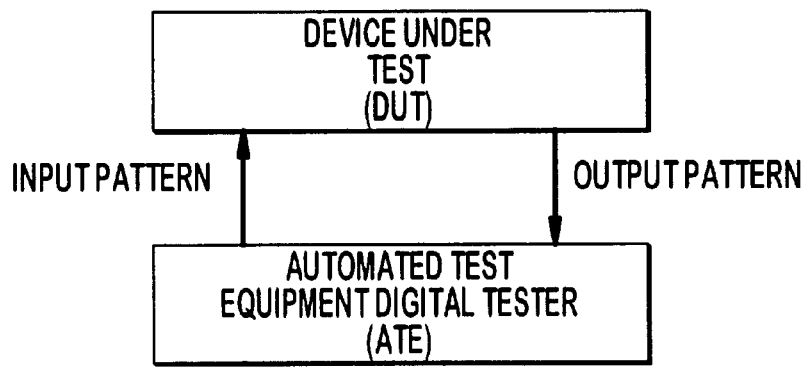
FIG. 2 is a block diagram of a conventional automated test equipment of the prior art shown coupled to a DUT.

FIG. 2 is a block diagram of a conventional ATE digital tester shown coupled to a DUT. To test a DUT, an input pattern comprising test signals is transferred from a processor, through the ATE tester channels to the DUT signal pins. This transfer is usually termed a vector set load. A vector is a list of input and output states which are valid for one period of the clock in the ATE. A vector set is a list of vectors containing signal data for many clock periods of the test vector generator.

First, the test vector sets are loaded into the vector memory of an ATE. The ATE then transfers an input pattern, known as vector set load, to the input signal pins of the DUT. In return, the DUT generates a response known as an output pattern at its output signal pins. The vector set load comprises an input test signal set with an expected and known output pattern response. If the output pattern response from DUT signal pins does not match the known response, a defect is indicated. In a typical ATE, a single signal pin may be used both as an output signal pin and as an input signal pin.

In prior art ATEs, especially in ATEs with bus architectures, the load time for loading test vector sets into the vector memory is usually many times longer than the actual test time for testing DUTs. The load time is very long because, in prior art channel assignments create a need for multiple data transfers to load a single test vector into vector memory.

The present invention offers an improved way of assigning channels on an ATE to the various signal pins on a DUT. The improvement involves creating an interface board by wiring the DUT signal pins to as few channel groups as possible.

Figure 3:
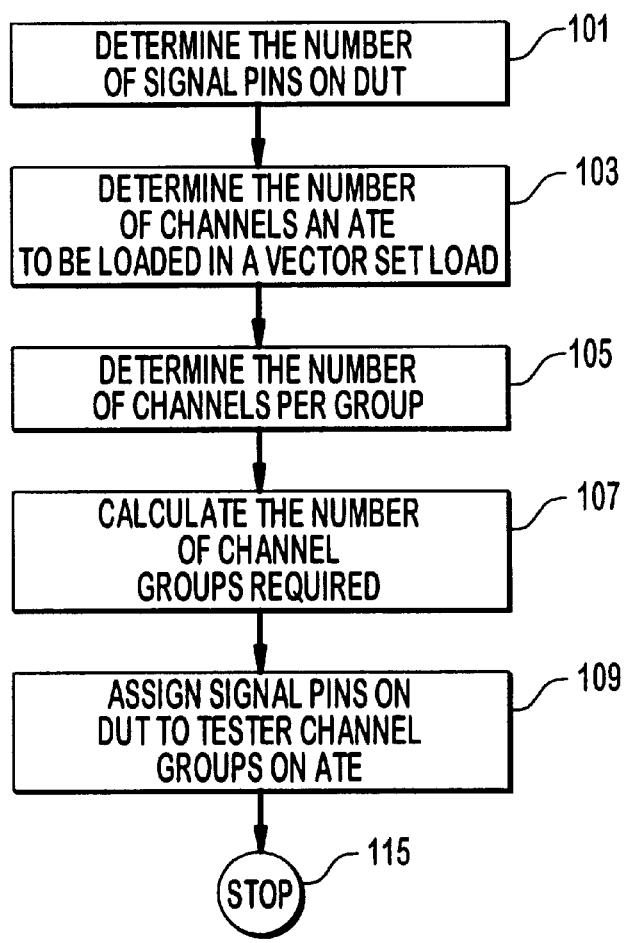
FIG. 3 is a flow-chart of a preferred embodiment of the present invention depicting the operational flow of the method of assigning signal pins of a DUT to tester channels on an ATE for a single vector set load.

FIG. 3 is a flowchart illustrating the various steps of the inventive method. The present invention provides a systematic method for assigning signal pins on a DUT to the tester channels on an ATE. Then, an interface board can be custom made having the determined DUT pin to ATE tester channel assignments In FIG. 3, the process begins with step 101 by determining the number of signal pins on the DUT to be tested. In the next step 103, the number of tester channels, herein termed channels, to be used in one vector set load are determined. This step involves the determination by an ATE of the number of signal pins which may be downloaded with test information by a vector set load. One signal pin on a DUT corresponds to one tester channel on an ATE. Therefore, the number of signal pins to be tested corresponds to the number of tester channels. In a typical ATE, this step is performed by a processor.

The next step 105, involves the determination of the number of channels present in a channel group. In a typical ATE, the tester channels are grouped in various channel groups. Each channel group comprise the same number of tester channels. This is a standard feature which comes as a set parameter with ATE. A typical channel group on an ATE has eight tester channels.

The next step 107, is to calculate the number of channel groups required for a particular vector set load. This step involves a simple mathematical calculation of dividing the total number of tester channels to be loaded determined in step 103, by the number of channels in a group, determined in step 105. The result provides the number of channel groups required. If the result is a fraction, then the number is rounded up to the next higher integer, i.e., 9.2 will be rounded up to 10.

In the next step 109, the DUT signals pins are assigned to the ATE tester channels to ensure that the fewest number of channel groups are used for a vector set load. This involves taking the first signal pin and assigning it to the first channel in the first channel group, then taking the second signal pin in a systematic manner and assigning it to the second channel in the first group. This step is repeated until all the signals have been assigned. The key is to complete the assignments to all the tester channels in the first channel group before starting assignments in the next channel group. In a typical ATE, these assignments may be made by a routing software or a router.

After making all the assignments, the process ends in at step 115.

The above mentioned systematic approach achieves a considerable savings over the prior art schemes.

In the present invention, the signal pins are assigned in a systematic manner to the least number of channel groups. As the channel groups to be loaded are reduced, the vector load time is also reduced thereby improving the performance of ATEs.

Figure 4:
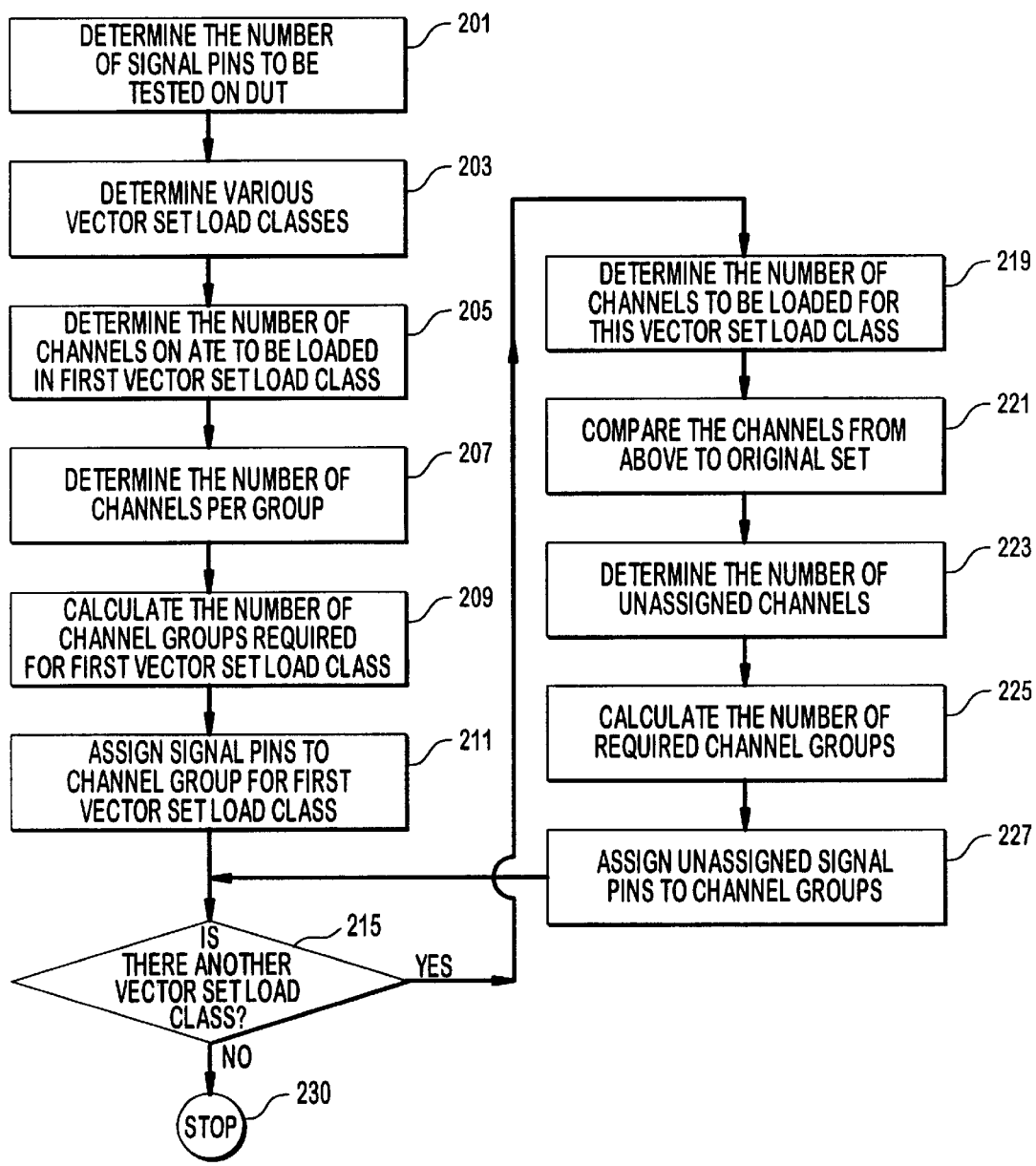
FIG. 4 is a flow-chart of an alternative embodiment of the present invention depicting the operational flow of the method of assigning signal pins of a DUT to tester channels on an ATE for a plurality of vector set loads.

FIG. 4 is an alternative embodiment in accordance with the principles of the present invention. This embodiment incorporates the method for assigning signal pins to tester channels for multiple vector set loads.

The process begins at step 201 by determining the number of signal pins on the DUT that will be used for testing. This is the determination of the total number of signal pins to be tested by a plurality of vector set loads.

In step 203, various vector set load classes are determined. A vector set load class comprises a plurality of vector set loads categorized together based upon some common signal pins or other properties. The method relies on reducing the number of iterations in a multiple vector set load case by categorizing a plurality of vector set loads in a single class. For example if first vector set load comprises data for signal pin number 1–10, and the second vector set load comprises data for signal pin number 2–11, the first and second vector set load will be categorized in a single vector set load class.

In step 205, the number of channels which will be loaded in the first vector set load class is determined. In step 207, the number of channels in a channel group is determined. This is a set parameter for each ATE, and the ATE documentation commonly has this information.

The next step 209 is to calculate the number of channel groups required for this particular vector set load class. This step involves a mathematical calculation of dividing the total number of channels from step 205 by the number of channels within a group from step 207. The result is the number of channel groups required. If the result is a fraction, the number is rounded to the next higher integer.

Then, in step 211, the signal pins from step 201 are assigned to the various channel groups in a systematic manner by starting with the first channel in the first channel group. In order to minimize the number of channel groups required, the first channel group is completely filled before proceeding to make assignments on the second channel group.

The next step 215, is a decision function to determine whether there is another vector set load class. If yes, in step 219, the total number of channels to be grouped in this particular vector set load is determined. The next step 221, involves comparing the channels from step 219 to the original channel set from step 205. This is a simple comparison and substraction function. The channels which are common to step 205 and to step 219 have already been assigned, and therefore are not considered.

In step 223, the number of remaining unassigned channels for this particular vector set load class are determined. Then, the number of channels groups required for unassigned channels are calculated in step 225. This step is similar to step 207, wherein the total number of unassigned channels from step 223 is divided by the number of channels in a group from step 207. The result is the number of channel groups required. If this number is a fraction, the result is rounded up to the next higher integer.

Next, the signal pins for this particular vector set load are assigned in a systematic manner in step 227. This step is similar to step 211. Once again, one channel group is completely assigned before proceeding to the next channel group. Within various vector set load classes, it is preferred to utilize the incomplete channel group assignments from the first vector set load class before proceeding to make assignments in the next channel group.

The process then returns to step 215 to determine if there is another vector set load. If yes, the iteration of steps 219–227 is repeated.

The process ends at step 230 after all the channels for all the vector set load classes have been assigned.

FIG. 4 depicts an efficient and systematic approach for assigning signal pins on a DUT to the tester channels on an ATE. Such approach brings tremendous cost and load time savings. By minimizing the number of channel groups, the number of required vector set loads is reduced. If no channels in a particular group are used, the data transfer for that group is eliminated. Therefore, by minimizing the number of channel groups assigned to the DUT, the vector load time is reduced significantly.

In the present invention, the overhead of vector load time for ATEs is reduced significantly. As modern ATEs use multi-layer interface boards, the signal pins can be assigned to assigned channel groups without creating conductor trace routing problems on the interface board due to physical location of the pins.

Even greater improvements can be made when assigning tester channels for a digital signal processor (DSP) or similar device. Many of the test vector sets for these products utilize a relatively small number of signal pins. A typical Lucent DSP chip has 106 signal pins. An even a smaller number of pins (either 10 or 46) is used to download most of the executable tests to the DUT. The test vector sets only need to include data for the pins that will be changing state or from which data will be read. By using the current invention, one can achieve maximum improvement by assigning the subset of pins used to clock the device and download or upload data to as few channel groups as possible. This results in a huge reduction in vector load time for this type of vector set.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

What is claimed is:

1. A method for assigning a plurality of signal pins of a device under test to a plurality of tester channels on an automated test equipment in order to minimize a number of vector set loads to test said device under test, said method comprising the steps of:

(i) determining the number of said tester channels to be loaded in a vector set load for said device under test;

(ii) determining the number of channels in a channel group of said automated test equipment;

(iii) determining from said number of tester channels determined in step (i) and said number of channels in a channel group determined in step (ii) the minimum number of channel groups required to accommodate said determined number of tester channels; and (iv) assigning said signal pins to said channel groups in a manner so as to utilize said minimum number of channel groups.

2. The method of claim 1 wherein step (i) comprises determining the number of said signal pins of said device under test upon which signals are to be placed and read in a vector set load.

3. The method of claim 1 wherein said step (iii) comprises dividing said number of signal pins by the number of channels in a channel group to determine said minimum number.

4. The method of claim 3 wherein said number of channels in a group is a set parameter for said automated test equipment.

5. The method of claim 3 wherein step (iii) further includes the step of rounding off any non-integer minimum number to the next higher integer.

6. The method of claim 1 wherein steps (i), (iii), and (iv) are repeated for each vector set load in a series of vector set loads.

7. The method of claim 1 wherein steps (iii) and (iv) are repeated only for tester channels which have not been assigned in a previous iteration.

8. The method of claim 1 wherein said method further comprises the step of designing an interface board in accordance with the assignment of said signal pins to said channel groups in step (iv).

9. A method for assigning a plurality of signal pins of a device under test to a plurality of tester channels on an automated test equipment in order to minimize a number of vector set loads to test said device under test, said method comprising the steps of:

(i) determining the number of said tester channels to be loaded in a vector set load for said device under test;

(ii) determining the number of channels in a channel group of said automated test equipment;

(iii) dividing said number of tester channels determined in step (i) by the number of channels in a channel group determined in step (ii);

(iv) rounding off any non-integer result obtained in step (iii) to the next higher integer;

(v) determining the minimum number of channel groups required to accommodate said number of tester channels determined in step (i); and (vi) assigning said signal pins to said channel groups in a manner so as to utilize said minimum number of channel groups determined in step (v).

10. The method of claim 9 wherein said number of channels in a group is a set parameter for said automated test equipment.

11. The method of claim 9 wherein step (vi) comprises completing assignments to a first channel group completely and then proceeding to the next channel group.

12. The method of claim 9 wherein steps (i), (ii), and (iii) are repeated for each vector set load in a series of vector set loads.

13. The method of claim 9 wherein steps (ii) and (iii) are repeated only for tester channels which have not been assigned in a previous iteration.

14. A device for assigning a plurality of signal pins of a device under test to a plurality of tester channels on an automated test equipment in order to minimize a number of vector set loads to test said device under test, said device comprising:

(i) means for determining the number of said tester channels to be loaded in a vector set load for said device under test;

(ii) means for determining the number of channels in a channel group of said automated test equipment;

(iii) means for determining from said number of tester channels determined in step (i) and said number of channels in a channel group determined in step (ii) the minimum number of channel groups required to accommodate said determined number of tester channels; and (iv) means for assigning said signal pins to said channel groups in a manner so as to utilize said minimum number of channel groups.

15. The device of claim 14 wherein said device further comprises means for determining the number of said signal pins of said device under test upon which signals are to be placed and read in a vector set load.

16. The device of claim 14 wherein said device further comprises means for dividing said number of signal pins by the number of channels in a channel group.

17. The device of claim 14 wherein said device further comprises means for rounding off any non-integer minimum number to the next higher integer.

18. The device of claim 14 wherein said number of channels in a group is a set parameter for said automated test equipment.

19. The device of claim 14 wherein said device further comprises an interface board designed in accordance with the assignment of said signal pins by said means for assigning.

20. The device of claim 14 wherein said device is configured by instructional means.

21. A device for assigning a plurality of signal pins of a device under test to a plurality of tester channels on an automated test equipment for a vector set load, said automated test equipment having a predetermined number of channels per channel group, said device comprising:

(i) a processor for determining the number of said tester channels to be loaded in a vector set load for said device under test and for determining the minimum number of channel groups required to accommodate said determined number of tester channels; and (ii) a router for assigning said signal pins to said channel groups in a manner so as to utilize said number of channel groups.

22. The device of claim 21 wherein said processor comprises a circuit for calculating the number of said signal pins of said device under test upon which signals are to be placed and read in a vector set load.

23. The device of claim 22 wherein said processor further comprises a circuit for dividing said number of signal pins by the number of channels in a channel group and for rounding off any non-integer minimum number to the next higher integer.

24. The device of claim 21 wherein said device further comprises an interface board designed in accordance with said assignment of said signal pins by said router.

25. The device of claim 21 wherein said device is configured by instructional means.

* * * * *